United States Patent
Jeon (10) Patent No.: US 9,851,413 B2
(45) Date of Patent: Dec. 26, 2017

(54) METHOD AND APPARATUS FOR ESTIMATING CURRENT

(71) Applicant: Samsung Electronics Co., Ltd., Suwon-si (KR)

(72) Inventor: Jinyong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 14/795,144

(22) Filed: Jul. 9, 2015

(65) Prior Publication Data

US 2016/0187427 A1 Jun. 30, 2016

(30) Foreign Application Priority Data

Dec. 29, 2014 (KR) ........................ 10-2014-0192712

(51) Int. Cl.
*G01R 31/36* (2006.01)
*G01R 35/00* (2006.01)

(52) U.S. Cl.
CPC ....... *G01R 31/3658* (2013.01); *G01R 31/362* (2013.01); *G01R 31/3679* (2013.01); *G01R 35/00* (2013.01)

(58) Field of Classification Search
CPC .............. G01R 31/3658; G01R 31/362; G01R 31/3679
USPC ....................................................... 320/434
See application file for complete search history.

(56) References Cited

U.S. PATENT DOCUMENTS

| | | | |
|---|---|---|---|
| 6,417,670 B1 | 7/2002 | Kang | |
| 7,098,666 B2 * | 8/2006 | Patino | G01R 31/362 320/151 |
| 7,808,244 B2 | 10/2010 | Barsukov et al. | |
| 8,207,706 B2 | 6/2012 | Ishikawa | |
| 8,278,876 B2 | 10/2012 | Bucur et al. | |
| 8,508,232 B2 | 8/2013 | Yugou et al. | |
| 8,519,675 B2 * | 8/2013 | Plett | G01R 31/3624 320/132 |
| 8,829,911 B2 * | 9/2014 | Rich | H01M 10/42 320/106 |
| 8,988,078 B2 * | 3/2015 | Kiuchi | G01R 31/3658 320/127 |
| 9,018,956 B2 * | 4/2015 | Eguchi | G01R 31/3627 320/116 |
| 9,541,975 B2 * | 1/2017 | Ukai | G01R 31/3693 |
| 2008/0224709 A1 * | 9/2008 | Tae | G01R 31/3662 324/430 |
| 2011/0148424 A1 | 6/2011 | Chiang et al. | |
| 2012/0218794 A1 * | 8/2012 | Kake | H02J 3/38 363/95 |

(Continued)

FOREIGN PATENT DOCUMENTS

| | | |
|---|---|---|
| KR | 10-2007-0043150 A | 4/2007 |
| KR | 10-2013-0060622 A | 6/2013 |

(Continued)

*Primary Examiner* — M'Baye Diao
(74) *Attorney, Agent, or Firm* — NSIP Law (57) ABSTRACT

A method and apparatus for estimating current is disclosed. The current estimation apparatus may receive a voltage value of a battery pack and voltage values of cells included in the battery pack, and may estimate a current of the battery pack based on the voltage value of the battery pack, the voltage values of the cells included in the battery pack, and resistance components within the battery pack.

14 Claims, 7 Drawing Sheets

(56) References Cited

U.S. PATENT DOCUMENTS

| | | | | |
|---|---|---|---|---|
| 2012/0290234 A1* | 11/2012 | Schaefer | ............ | G01R 31/3624 |
| | | | | 702/63 |
| 2014/0002094 A1* | 1/2014 | Champlin | .......... | G01R 31/3624 |
| | | | | 324/426 |
| 2014/0278174 A1* | 9/2014 | Biskup | ................... | G01R 27/14 |
| | | | | 702/65 |
| 2015/0236525 A1* | 8/2015 | Aridome | .............. | G01R 31/362 |
| | | | | 320/107 |
| 2016/0124051 A1* | 5/2016 | Prasad | ............... | G01R 31/3651 |
| | | | | 324/426 |
| 2016/0363632 A1* | 12/2016 | Park | ................... | G01R 31/3658 |
| 2017/0089955 A1* | 3/2017 | Yugou | ................. | G01R 15/146 |

FOREIGN PATENT DOCUMENTS

| KR | 10-1399345 B1 | 5/2014 |
|---|---|---|
| KR | 10-2014-0070148 A | 6/2014 |
| KR | 10-1440719 B1 | 9/2014 |

\* cited by examiner

| Resistance \ Temperature | -40 | -30 | -20 | -10 | 0 | 10 | 30 | 40 | 40 |
|---|---|---|---|---|---|---|---|---|---|
| Rn.n | 200 | 190 | 180 | 170 | 160 | 150 | 130 | 120 | 120 |
| Rbus.n | 550 | 530 | 500 | 400 | 380 | 370 | 370 | 350 | 300 |
| Rw1, Rw2 | 20 | 20 | 20 | 19 | 18 | 18 | 15 | 15 | 10 |
| Rt.1, Rt.2 | 300 | 280 | 270 | 250 | 250 | 250 | 260 | 260 | 280 |

METHOD AND APPARATUS FOR ESTIMATING CURRENT

CROSS-REFERENCE TO RELATED APPLICATION(S)

This application claims the benefit under 35 USC 119(a) of Korean Patent Application No. 10-2014-0192712, filed on Dec. 29, 2014, in the Korean Intellectual Property Office, the entire disclosure of which is incorporated herein by reference for all purposes.

BACKGROUND

1. Field

The following description relates to a method and apparatus for estimating current.

2. Description of Related Art

Technology capable of more accurately and efficiently managing a battery has become a key issue in the field of an electric vehicle and an electric bicycle equipped with a battery system. In a driving device of the electric vehicle and the electric bicycle, a battery functions as an engine and a fuel tank of a gasoline vehicle. Accordingly, to achieve the safety of a user, it is important to accurately verify a state of the battery.

When verifying the state of the battery, a current of the battery is one of key parameters. The battery may be safely and efficiently managed by performing cell balancing on cells constituting the battery based on current of the battery. The current of the battery may be verified only using a current sensor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating current, the method including receiving a voltage value of a battery pack and voltage values of cells included in the battery pack from a voltage sensor, and estimating current of the battery pack based on the voltage value of the battery pack, the voltage values of the cells included in the battery pack, and resistance components within the battery pack.

The resistance components may include resistance values of elements included in the battery pack.

The elements included in the battery pack may include a connection tab configured to connect the cells, a busbar including a portion of the cells, and configured to connect battery modules constituting the battery pack, a terminal of the battery pack, and an inner wire of the battery pack.

The resistance values may vary based on operating temperatures of the elements included in the battery pack and operating times of the elements included in the battery pack.

The current estimation method may further include determining malfunctioning of a current sensor to measure the current of the battery pack. The current of the battery pack may be estimated in response to determining the malfunctioning of the current sensor.

The malfunctioning of the current sensor may be determined in response to a current value received from the current sensor corresponding to one end of a range outputtable from the current sensor.

The determining of the malfunctioning of the current sensor may include comparing a decrease width of voltage predicted based on a current value received from the current sensor and a decrease width of voltage verified through the voltage sensor.

A result of estimating the current may be utilized to estimate at least one of a state of charge (SOC), a state of health (SOH), and a state of function (SOF) of the battery pack.

The current estimation method may further include compensating for a current value received from a current sensor to measure the current of the battery pack, based on a result of estimating the current.

The current of the battery pack may be estimated by further utilizing an inductance component generated by an inner wire of the battery pack.

In another general aspect, there is provided a current estimation apparatus including a receiver configured to receive a voltage value of a battery pack and voltage values of cells included in the battery pack from a voltage sensor, and an estimator configured to estimate current of the battery pack based on the voltage value of the battery pack, the voltage values of the cells included in the battery pack, and resistance components within the battery pack.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter examples will be described with reference to the accompanying drawings. The following predetermined structural and functions descriptions are provided to describe the examples and thus, the scope of the examples should not be interpreted to be limited to the description. Various changes, alternations, and modifications may be made by those skilled in the art from the following description. Also, like reference numerals refer to like constituent elements throughout and a known function and structure will be omitted.

Figure 1:
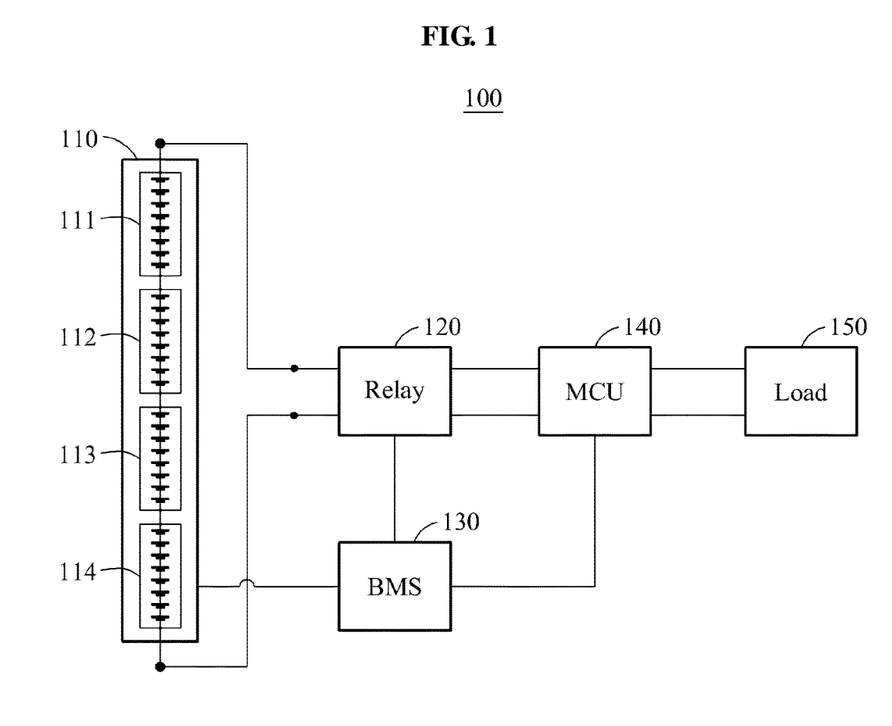
FIG. 1 illustrates an example of a battery system.

FIG. 1 illustrates an example of a battery system.

Referring to FIG. 1, the battery system 100 includes a battery pack 110, a relay 120, a battery management system (BMS) 130, and a load 150. The battery system 100 further includes a motor control unit (MCU) 140. For example, the battery system 100 may be an energy storage system (ESS). Additionally, although FIG. 1 illustrates the battery pack 110, the relay 120, the BMS 130, the MCU 140 and the load 150 included in the battery system 100, the battery system 100 may include more or less components. Therefore, the battery system 100 illustrated in FIG. 1 is not limited thereto.

The battery pack 110 supplies power to a driving device, for example, an electric vehicle and an electric bicycle, equipped with the battery system 110, or receives power from the driving device. The battery pack 110 includes a plurality of battery modules 111, 112, 113, and 114 connected in series but is not limited thereto. That is, the battery modules 111, 112, 113 and 114 may also be connected in parallel or in a combination of series and parallel. For example, the battery modules 111, 112, 113, and 114 may be secondary batteries such as a lithium ion battery. The battery modules 111, 112, 113, and 114 may have the same capacity or voltage, or may have differing capacity or voltage. In accordance with one configuration, each of the battery modules 111, 112, 113, and 114 may include a plurality of cells connected in series. Although FIG. 1 illustrates that four battery modules 111, 112, 113, and 114 are included in the battery pack 110, FIG. 1 is only an example and the battery pack 110 may include at least one battery module.

The relay 120 controls power to be transferred from the battery pack 110 to the load 150 by switching a connection between the battery pack 110 and the load 150. For example, when an ignition key of the driving device equipped with the battery system 100 is in an ON state, the relay 120 connects the battery pack 110 and the load 150 to each other. Accordingly, the battery pack 110 is discharged and power is supplied to the load 150. Meanwhile, when the ignition key of the driving device is in an OFF state, the relay 120 cuts off a connection between the battery pack 110 and the load 150. Similarly, the relay 120 controls power to be transferred from the load 150 to the battery pack 110 by switching a connection between the battery pack 110 and the load 150.

For example, when the battery pack 110 malfunctions, for example, when overcurrent occurs in the battery pack 110, the relay 120 cuts off a connection between the battery pack 110 and the load 150. The relay 120 is controlled by the BMS 130, and the relay 120 may be configured to include a plurality of relays.

Figure 3A:
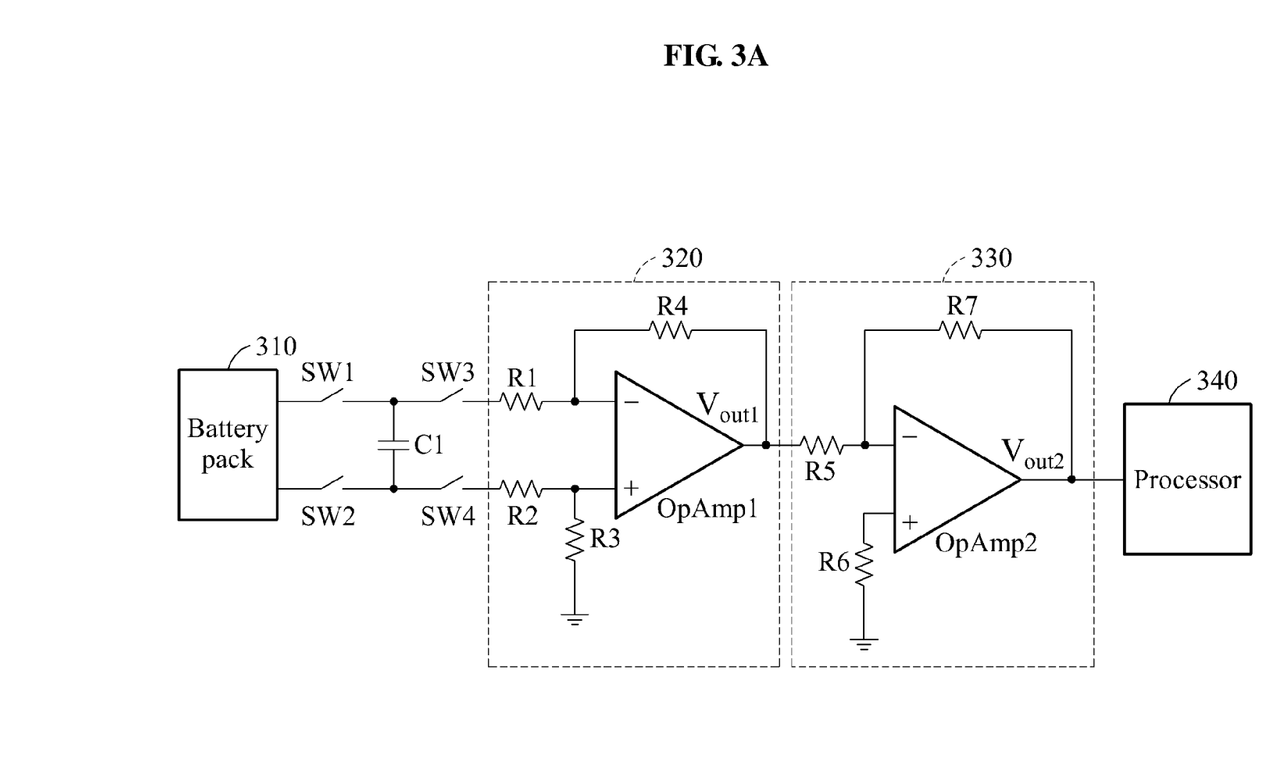
FIGS. 3A and 3B illustrate examples of measuring voltage of a battery pack and voltages of cells included in the battery pack.
Figure 3B:
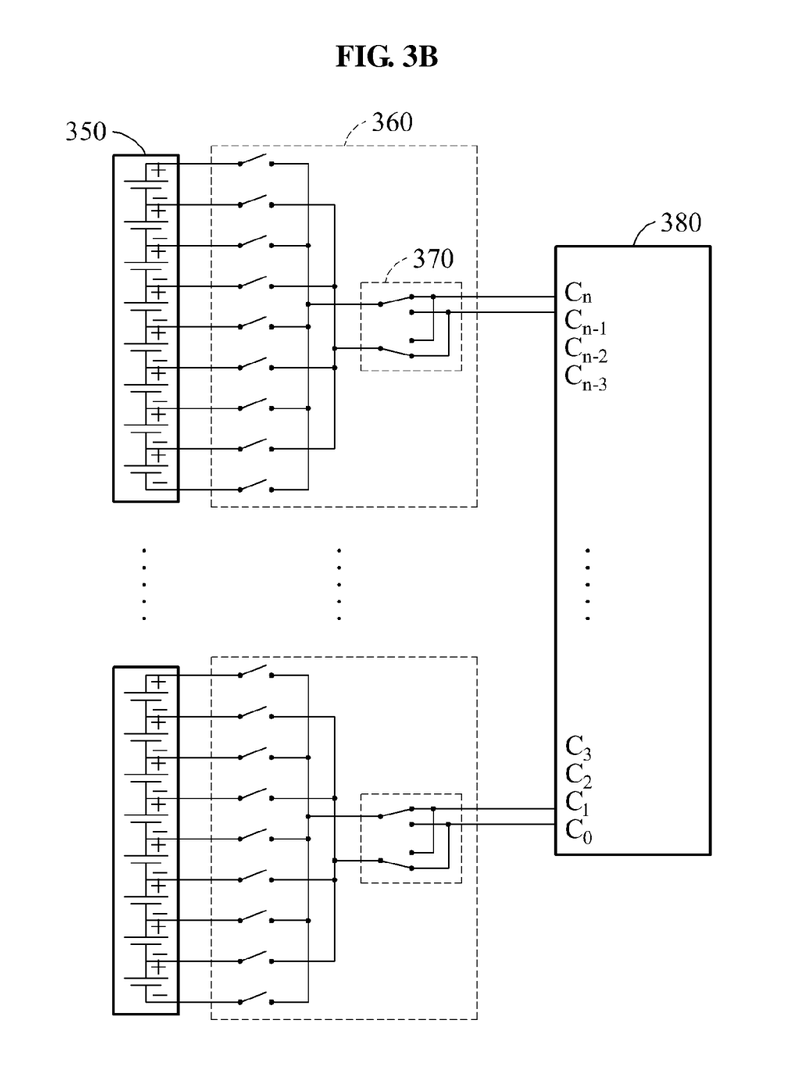

In accordance with one configuration, the BMS 130 may be an element to monitor a state of the battery pack 110 and to control the battery pack 110. For example, the BMS 130 monitors current, voltage, and temperature of the battery pack 110. In one configuration, the BMS 130 measures the voltage of the battery pack 110 through a current sensor provided in a plus terminal or a minus terminal of the battery pack 110. The BMS 130 measures the voltage of the battery pack 110 and voltages of cells included in the battery pack 110. A description related thereto will be made with reference to FIG. 3.

The BMS 130 performs a heat control of the battery modules 111, 112, 113, and 114 included in the battery pack 110. In one configuration, the BMS 130 controls a charging state to be equivalent among the battery modules 111, 112, 113, and 114 by preventing overcharging and over-discharging of the battery modules 111, 112, 113, and 114 and by performing cell balancing. Accordingly, the energy efficiency of the battery modules 111, 112, 113, and 114 may be enhanced and the lifespan of the battery modules 111, 112, 113, and 114 may be extended.

In accordance with another configuration, the BMS 130 estimates a state of charge (SOC), a state of health (SOH), and a state of function (SOF) of the battery pack 110. The SOC indicates information about an amount of charge received in the battery pack 110, the SOH indicates a degradation level of performance of the battery pack 110 compared to the performance when the battery pack 110 is manufactured, and the SOF indicates information about a matching level between the performance of the battery pack 110 and a predetermined condition. The current of the battery pack 110 is an essential element to estimate the SOC, the SOH, and the SOF. The SOC, the SOH, and the SOF of the battery pack 110 may be utilized to represent the SOC, SOH, and SOF of the cells included in the battery pack 110.

The BMS 130 provides at least one of the SOC, the SOH, and the SOF to the MCU 140. For example, in one configuration, the BMS 130 communicates with the MCU 140 over a controller area network (CAN) but is not limited thereto. That is, the BMS 130 may communicate with the MCU 140 over a wireless network.

The MCU 140 controls an operation of the load 150. The MCU 140 prevents overcharging or over-discharging of the battery pack 110 by controlling an operation of the load 150 based on at least one of the SOC, the SOH, and the SOF received from the BMS 130. For example, the MCU 140 may be replaced with an electronic control unit (ECU) to control the load 150 that is an electronic device.

The load 150 operates with the power supplied from the battery pack 110. Depending on examples, the load 150 supplies power to the battery pack 110 by converting an operation of the load 150 to electric energy. For example, the load 150 includes a motor or an electronic device.

In general, the BMS 130 receives a current value of the battery pack 110 from the current sensor. In this example, when the current value is not received from the current sensor, or when accuracy of the current value received from the current sensor is low, the BMS 130 estimates the current of the battery pack 110 based on other parameters of the battery pack 110. The BMS 130 may operate as a current estimation apparatus to estimate the current of the battery pack 110. Hereinafter, for conciseness, the BMS 130 is referred to as the current estimation apparatus.

Figure 2:
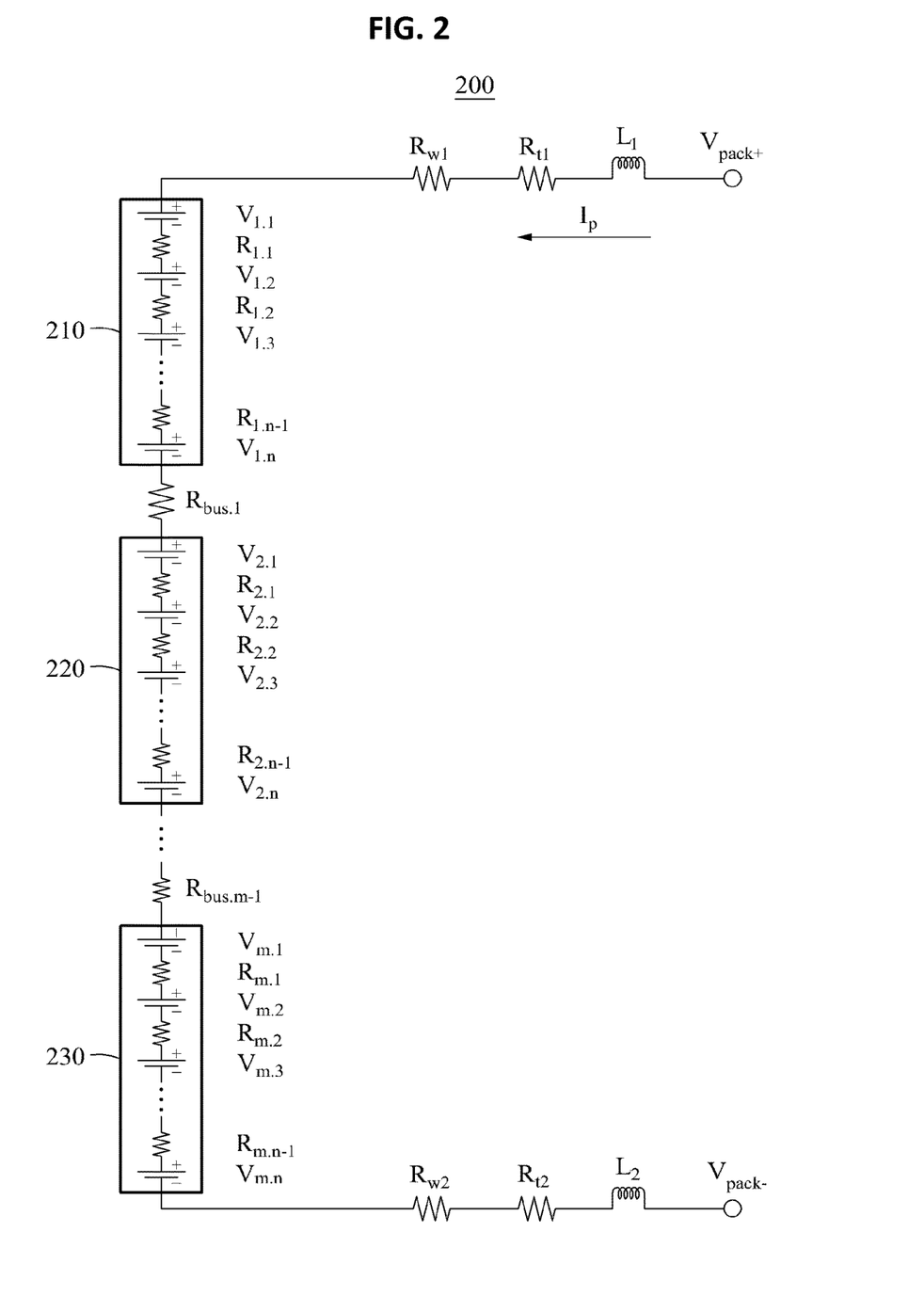
FIG. 2 is an equivalent circuit illustrating an example of a battery pack.

FIG. 2 is an equivalent circuit illustrating an example of a battery pack.

Referring to FIG. 2, in accordance with one configuration, the battery pack 200 includes battery modules 210 through 230, busbars $R_{bus.1}$ through $R_{bus.m-1}$ to connect the battery modules 210 through 230, terminals $R_{t.1}$ and $R_{t.2}$ of the battery pack 200, and inner wires $R_{w1}$ and $R_{w2}$ of the battery pack 200. Further, the battery modules 210 through 230 include cells $V_{1.1}$ through $V_{1.n}$, $V_{2.1}$ through $V_{2.n}$, ..., $V_{m.1}$ through $V_{m.n}$ and connection tabs $R_{1.1}$ through $R_{1.n-1}$, $R_{2.1}$ through $R_{2.n-1}$, ..., $R_{m.1}$ through to connect the cells $V_{1.1}$ through $V_{1.n}$, $V_{2.1}$ through $V_{2.n}$, ..., $V_{m.1}$ through $V_{m.n}$, respectively. The battery pack 200 including various constituent elements may be expressed as the equivalent circuit of FIG. 2.

In accordance with one configuration, the battery modules 210 through 230 include the cells $V_{1.1}$ through $V_{1.n}$, $V_{2.1}$ through $V_{2.n}$, ..., $V_{m.1}$ through $V_{m.n}$, and the connection tabs $R_{1.1}$ through $R_{1.n-1}$, $R_{2.1}$ through $R_{2.n-1}$, ..., $R_{m.1}$ through $R_{m.n-1}$ to connect the cells $V_{1.1}$ through $V_{1.n}$, $V_{2.1}$ through $V_{2.n}$, ..., $V_{m.1}$ through $V_{m.n}$. Here, a connection tab may have a resistance value corresponding to a portion that connects cells included in a battery module. For example, the connection tab may correspond to a welded portion for connecting two cells.

The busbars $R_{bus.1}$ through $R_{bus.m-1}$ correspond to a portion for connecting the battery modules 210 through 230. A busbar may have a resistance value corresponding to a portion that connects one battery module and another battery module.

The terminals $R_{t.1}$ and $R_{t.2}$ are elements provided at both ends of the battery pack 200, and the battery pack 200 are connectable to an external device through the terminals $R_{t.1}$ and $R_{t.2}$. For example, the terminal $R_{t.1}$ corresponds to a plus terminal $V_{pack+}$ of the battery pack 200 and the terminal $R_{t.2}$ corresponds to a minus terminal $V_{pack-}$ of the battery pack 200.

The inner wires $R_{w1}$ and $R_{w2}$ are electric wires to connect elements included in the battery pack 200, and correspond to electric wires from the plus terminal $V_{pack+}$ to the minus terminal $V_{pack-}$ of the battery pack 200. The inner wire $R_{w1}$ represents an electric wire adjacent to the plus terminal $V_{pack+}$ of the battery pack 200, and the inner wire $R_{w2}$ represents an electric wire adjacent to the minus terminal $V_{pack-}$ of the battery pack 200. The inner wires $R_{w1}$ and $R_{w2}$ of FIG. 3 are only an example and thus, may be illustrated as resistance.

In an example, the battery pack 200 may include long inner wires $R_{w1}$ and $R_{w2}$. The inner wires $R_{w1}$ and $R_{w2}$ may have inductance components. The battery pack 200 may represent the inductance components as inductors $L_1$ and $L_2$. For example, the inductors $L_1$ and $L_2$ may represent inductance components varying based on a frequency of a current of the battery pack 200.

By applying a Kirchhoff's voltage law (KVL) to the battery pack 200 of FIG. 2, Equation 1 may be induced as follows.

$$V_{pack} = (V_{1.1} + V_{1.2} + \ldots + V_{1.n}) + \ldots + (V_{m.1} + V_{m.2} + V_{m.n}) + I_p\{Z_{total}\}$$

$$Z_{total} = (R_{1.1} + R_{1.2} + \ldots + R_{1.n-1}) + \ldots + (R_{m.1} + R_{m.2} + \ldots + R_{m.n-1}) + (R_{bus.1} + R_{bus.2} + \ldots + R_{bus.m-1}) + (R_{w1} + R_{w2}) + (R_{t1} + R_{t2}) + (jwL1 + jwL2)$$

Equation 1

In Equation 1, $V_{pack}$, as voltage of the battery pack 200, denotes a voltage difference between the plus terminal $V_{pack+}$ and the minus terminal $V_{pack-}$ of the battery pack 200. $I_p$ denotes the current flowing in the battery pack 200 and $Z_{total}$ denotes an impedance component within the battery pack 200. As shown in Equation 1, the impedance component $Z_{total}$ may include resistance components within the battery pack 200 and inductance components $jwL_1+jwL_2$ within the battery pack 200. That is, the resistance components within the battery pack 200 may indicate remaining components excluding the inductance components $jwL_1+jwL_2$ from the impedance component $Z_{total}$.

In general, since the current $I_p$ flowing in the battery pack 200 has a relatively low frequency, the inductance components $jwL_1+jwL_2$ having occurred due to the inner wires $R_{w1}$ and $R_{w2}$ may give relatively small effect to the current $I_p$ flowing in the battery pack 200 compared to resistance values of other elements. Accordingly, the inductance components $jwL_1+jwL_2$ can be ignored in Equation 1.

Resistance values or impedance values of elements included in the battery pack 200 may be determined in advance at a stage of manufacturing the battery pack 200.

FIGS. 3A and 3B illustrate examples of measuring voltage of a battery pack and voltages of cells included in the battery pack.

FIG. 3A is a circuit diagram illustrating an example of measuring a voltage of the battery pack 310. The scope of examples is not limited to the circuit diagram of FIG. 3A and a variety of methods capable of measuring the voltage of the battery pack 310 may be applicable.

Referring to FIG. 3A, in accordance with one configuration, the battery pack 310, as a device including a plurality of battery modules, outputs high voltage. In contrast, a processor 340 of a voltage sensor which measures a voltage of the battery pack 310 measures only a voltage less than an output voltage of the battery pack 310 and thus, there is no need to decompress the output voltage of the battery pack 310. Due to the great output voltage of the battery pack 310, the processor 340 may malfunction even when a small ripple is present in the output voltage of the battery pack 310. Accordingly, the ripple present in the voltage of the battery pack 310 needs to be removed in order to measure the output voltage of the battery pack 310.

A capacitor C1 stores the output voltage of the battery pack 310 in a state in which switches SW1 and SW2 are turned ON and switches SW3 and SW4 are turned OFF. The capacitor C1 transfers the ripple-free output voltage of the battery pack 310 to a first transformer 320 in a state in which the switches SW1 and SW2 are turned OFF and the switches SW3 and SW4 are turned ON. In this example, the capacitor C1 may indicate a flying capacitor.

The first transformer 320 and a second transformer 330 decompress the output voltage of the battery pack 310 to an amplitude of voltage that may be measured by the processor 340. The processor 340 measures the output voltage of the battery pack 310 by measuring the decompressed voltage.

FIG. 3B is a circuit diagram illustrating an example of measuring voltages of cells included in a battery pack. The scope of examples is not limited to the circuit diagram of FIG. 3B and a variety of methods capable of measuring the voltages of cells may be applicable.

Referring to FIG. 3B, in accordance with one configuration, the battery pack includes a plurality of battery modules, and each of the battery modules includes a plurality of cells. A process of measuring voltages of cells is described based on a battery module 350.

Voltages of cells included in the battery module 350 are measured by a multiplexer 380 included in a voltage sensor. Switchers 360 and 370 selectively connect the multiplexer 380 and the cells. The multiplexer 380 selects a single cell from among the cells using the switchers 360 and 370, and measures voltage of the selected cell.

Figure 4A:
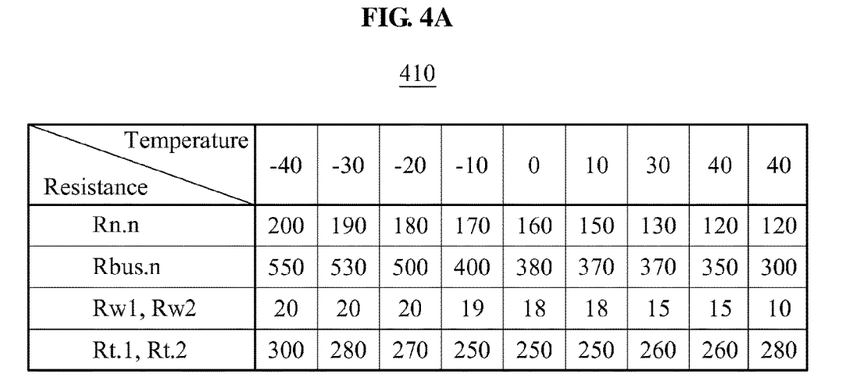
FIGS. 4A and 4B illustrate examples of resistance values of elements varying based on a temperature and a time.
Figure 4B:
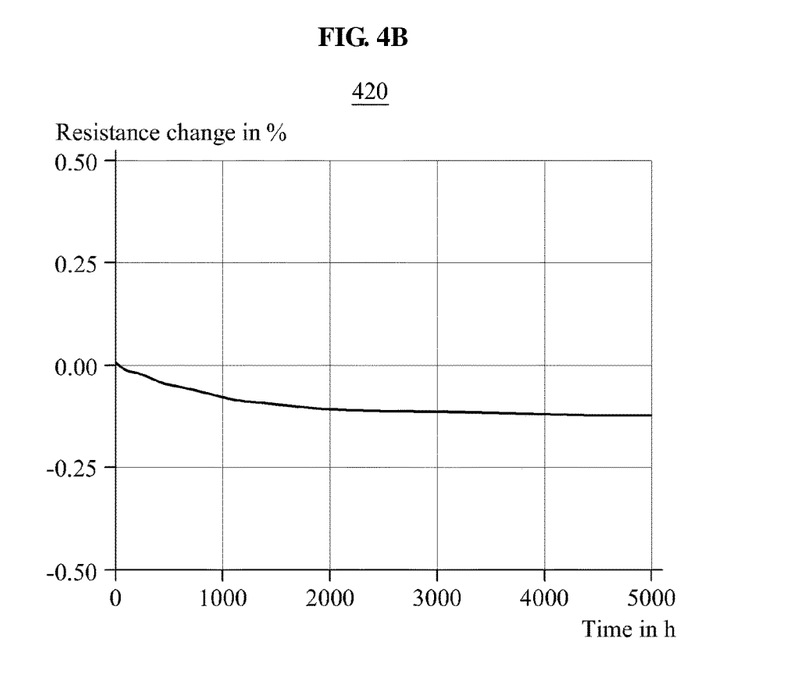

FIGS. 4A and 4B illustrate examples of resistance values of elements varying based on a temperature and a time.

A table 410 of FIG. 4A shows an example in which resistance values of elements vary based on an operating temperature. A horizontal axis of the table 410 denotes an operating temperature)(°) and a vertical axis denotes a resistance value (mΩ). Referring to the table 410, each of a connection tab $R_{m,n}$, a busbar $R_{bus,n}$, inner wires $R_{w1}$ and $R_{w2}$, and terminals $R_{t,1}$ and $R_{t,2}$ has a resistance value that varies based on an operating temperature. For example, an element has a relatively small resistance value according to an increase in an operating temperature. Alternatively, an element has a lowest resistance value at a predetermined operating temperature.

A graph 420 of FIG. 4B shows an example in which a resistance value of an element varies over time. A horizontal axis of the graph 420 denotes a time (h) and a vertical axis denotes a decrease rate (%) of a resistance value. For example, referring to the graph 420, an element has a resistance value having decreased by about 12.5% over time.

Figure 5:
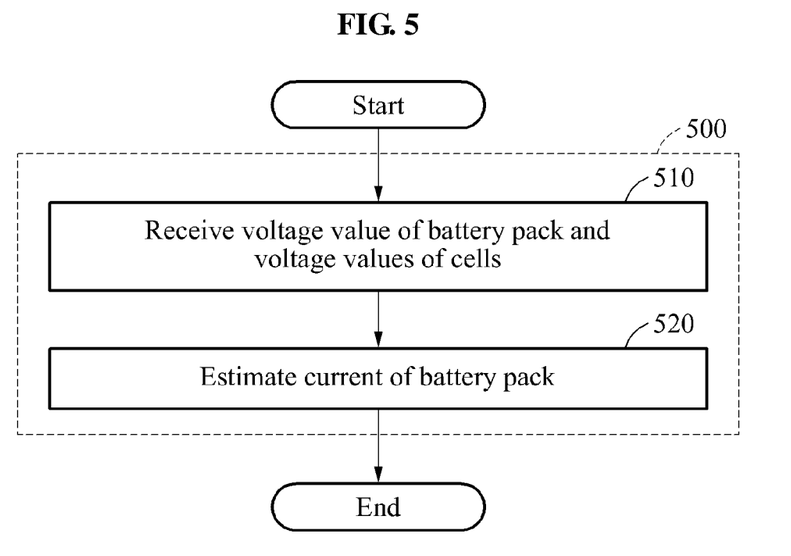
FIG. 5 illustrates an example of a current estimation method.

FIG. 5 illustrates an example of a current estimation method.

In accordance with one configuration, the current estimation method of FIG. 5 is performed by a processor included in a current estimation apparatus according to example embodiments.

In operation 510, the current estimation apparatus receives a voltage value of a battery pack and voltage values of cells included in the battery pack from a voltage sensor. For example, in one configuration, the voltage sensor measures an output voltage of the battery pack through decompression, but is not limited thereto. That is, the voltage sensor may measure the output voltage of the battery pack through other methods. The voltage sensor sequentially measures voltage values of cells included in the battery pack, but is not limited thereto. That is, the voltage sensor may concurrently measure the voltage values of the cells.

In operation 520, the current estimation apparatus estimates current of the battery pack based on the voltage value of the battery pack, the voltage values of cells, and resistance components within the battery pack. The resistance components include resistance values of elements included in the battery pack. The elements included in the battery pack include a connection tab configured to connect the cells, a busbar configured to connect battery modules, a terminal of the battery pack, and an inner wire of the battery pack. The resistance values of elements included in the battery pack may vary based on operating temperatures of the elements and operating times of the elements. For example, an element has a resistance value having decreased by a predetermined rate according to an increase in an operating time. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently.

The current estimation apparatus may estimate current $I_p$ of the battery pack based on Equation 1, as expressed by Equation 2.

$$I_p = \frac{V_{pack} - \{(V_{1,1} + V_{1,2} + \ldots + V_{1,n}) + \ldots + (V_{m,1} + V_{m,2} + V_{m,n})\}}{Z_{total}}$$

Equation 2

For example, the current estimation apparatus estimates at least one of the SOC, the SOH of the battery pack based on a result of estimating the current of the battery pack. For example, the current estimation apparatus may estimate at least one of the SOC, the SOH, and the SOF of the battery pack based on the current estimation result and the voltage value of the battery pack and the voltage values of cells received from the voltage sensor. Here, the estimated at least one of the SOC, the SOH, and the SOF relates to the battery modules or the cells included in the battery pack.

For example, the current estimation apparatus compensates for a current value received from a current sensor, based on the result of estimating the current of the battery pack. An error may occur in the current value output from the current sensor, based on an operating temperature of the current sensor. Further, an error by aging may occur according to an increase in an operating time of the current sensor. Accordingly, there is a need to compensate for an error in the current value output from the current sensor. The current estimation apparatus compensates the current value output from the current sensor based on the current estimation result.

Figure 6:
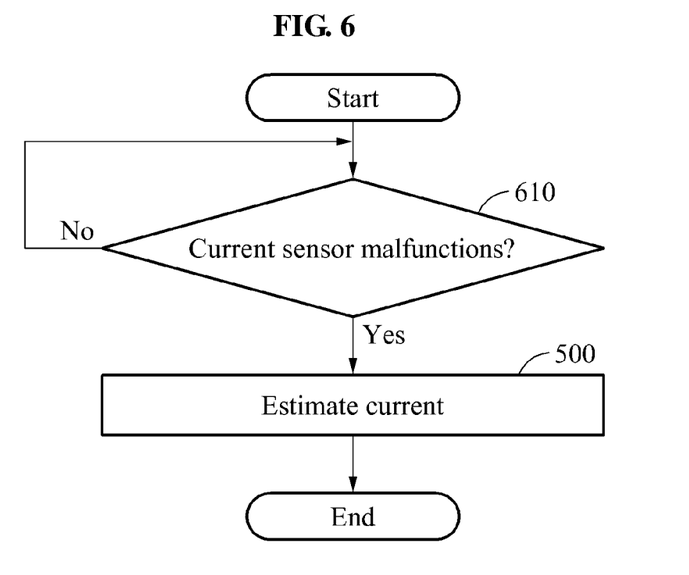
FIG. 6 illustrates an example of a circumstance of performing a current estimation method.

FIG. 6 illustrates an example of a circumstance of performing a current estimation method.

In accordance with one configuration, the current estimation method of FIG. 6 is performed in a circumstance in which a current sensor is determined to malfunction.

In operation 610, the current estimation apparatus determines whether the current sensor malfunctions.

For example, the current sensor which measures current of a battery pack is a device which outputs error information together with a current value. The error information includes malfunctioning of the current sensor and, if necessary, further includes an error code indicating a cause of the malfunction. The current estimation apparatus determines whether the current sensor malfunctions based on error information received from the current sensor.

For example, the current estimation apparatus determines whether the current sensor malfunctions based on a current value received from the current sensor and a voltage value received from a voltage sensor. That is, the current estimation apparatus verifies whether the current sensor malfunctions by comparing a decrease width of voltage predicted based on a measurement value of current received from the current sensor and a decrease width of voltage verified through the voltage sensor.

The current estimation apparatus predicts a decrease width of voltage of the battery pack according to an amount of current flowing from the battery pack to a load by monitoring a current value received from the current sensor. When a difference between the predicted decrease width of voltage and the decrease width of voltage verified through the voltage sensor is greater than a threshold, the current estimation apparatus determines that the current sensor malfunctions. Similarly, the current estimation apparatus predicts an increase width of voltage of the battery pack according to an amount of current flowing from the load to the battery pack by monitoring a current value received from the current sensor. When a difference between the predicted increase width of voltage and the increase width of voltage verified through the voltage sensor is greater than a threshold, the current estimation apparatus determines that the current sensor malfunctions.

For example, the current estimation apparatus determines whether the current sensor malfunctions by monitoring an output value of the current sensor. The current sensor outputs voltage corresponding to measured current. The current sensor outputs voltage within a range. When the current sensor accurately operates, the current sensor is designed not to output a value corresponding to one end of the range. That is, when the current sensor malfunctions due to short circuit and the like, the current sensor outputs a voltage corresponding to one end of the range. Accordingly, the current estimation apparatus determines whether the current sensor malfunctions based on whether a current value received from the current sensor corresponds to one end of the range outputtable from the current sensor.

For example, the current sensor may output voltage within the range of 0 to 5 volts (V). The current sensor may be designed to output 0.5V when a current of −200 A is measured, to output 4.5V when a current of 200 A is measured, and to output 2.5V when 0 A is measured. When the current sensor outputs voltage corresponding to one end of the range outputtable from the current sensor, the current estimation apparatus determines that the current sensor malfunctions due to a short circuit and the like. That is, when a current value received from the current sensor corresponds to one end of the range outputtable from the current sensor, the current estimation apparatus determines that the current sensor malfunctions.

In operation 500, when the current sensor is determined to malfunction, the current estimation apparatus measures the current of the battery pack. The current estimation apparatus receives the voltage value of the battery pack and voltage values of cells included in the battery pack from the voltage sensor. The current estimation apparatus estimates the current of the battery pack based on the voltage value of the battery pack, the voltage values of cells, and resistance components within the battery pack.

In accordance with one configuration, the resistance values include resistance values of elements included in the battery pack. The elements included in the battery pack include a connection tab configured to connect the cells, a busbar including a portion of the cells, and configured to connect battery modules constituting the battery pack, a terminal of the battery pack, and an inner wire of the battery pack. The resistance values of the elements vary based on operating temperatures of the elements and operating times of the elements.

Figure 7:
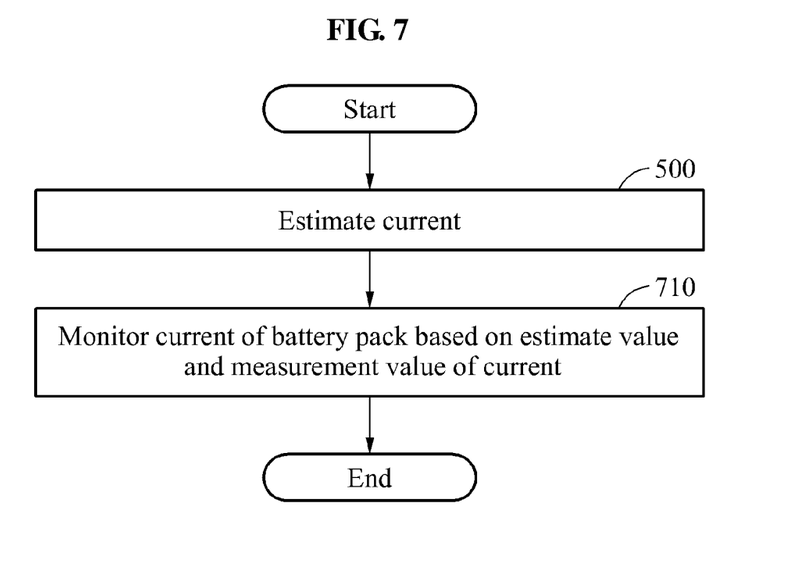
FIG. 7 illustrates another example of a circumstance of performing a current estimation method.

FIG. 7 illustrates another example of a circumstance of performing a current estimation method.

The current estimation method of FIG. 7 may be performed although a current sensor is determined not to malfunction. That is, the current estimation apparatus receives a current value from the current sensor, and generates a current estimation result according to the current estimation method. Hereinafter, for conciseness, the current value received from the current sensor is referred to as a measurement value of current and the current estimation result according to the current estimation method is referred to as an estimate value of current.

In operation 500, the current estimation apparatus estimates current of the battery pack. The current estimation apparatus receives a voltage value of the battery pack and voltage values of cells included in the battery pack from the voltage sensor. The current estimation apparatus generates an estimate value of current by estimating the current of the battery pack based on the voltage value of the battery pack, the voltage values of cells, and resistance components within the battery pack.

In operation 710, the current estimation apparatus monitors the current of the battery pack based on the estimate value and the measurement value of current.

For example, the current estimation apparatus monitors the current of the battery pack by compensating for a measurement value of current based on an estimate value of current. The current sensor is a device to measure the current of the battery pack and to output the measurement value of current, and outputs the measurement value of current including an error according to an operating temperature and an operating time. For example, when the current sensor operates in a low temperature or a high temperature, an error may be included in a measurement value of current output from the current sensor. Further, a measurement value of current including an error by aging according to an increase in an operating time of the current sensor may be output from the current sensor. Accordingly, the measurement value of current including the error needs to be compensated for. The current estimation apparatus may further accurately monitor the current of the battery pack by compensating for the measurement value of current based on the estimate value of current.

For example, the current estimation apparatus verifies whether the current sensor malfunctions based on a result of comparing an estimate value of current and a measurement value of current. When the current sensor is verified to malfunction, the current estimation apparatus verifies the current of the battery pack based on the estimate value of current.

The current estimation apparatus may verify whether a difference between an estimate value of current and a measurement value of current is greater than a threshold by monitoring current of the battery pack based on the measurement value of current received from the current sensor and by comparing the measurement value of current and the estimate value of current according to a current estimation method. When the difference between the estimate value of current and the measurement value of current is greater than the threshold, the current estimation apparatus may verify whether the current sensor malfunctions.

For example, the current estimation apparatus verifies whether the current sensor malfunctions based on error information received from the current sensor. The current estimation apparatus verifies whether the current sensor malfunctions based on a measurement value of current received from the current sensor and a voltage value received from the voltage sensor. The current estimation apparatus verifies whether the current sensor malfunctions based on whether the measurement value of current received from the current sensor corresponds to one end of a range outputtable from the current sensor.

When the current sensor is verified to malfunction, the current estimation apparatus monitors the current of the battery pack based on the estimate value of current.

Figure 8:
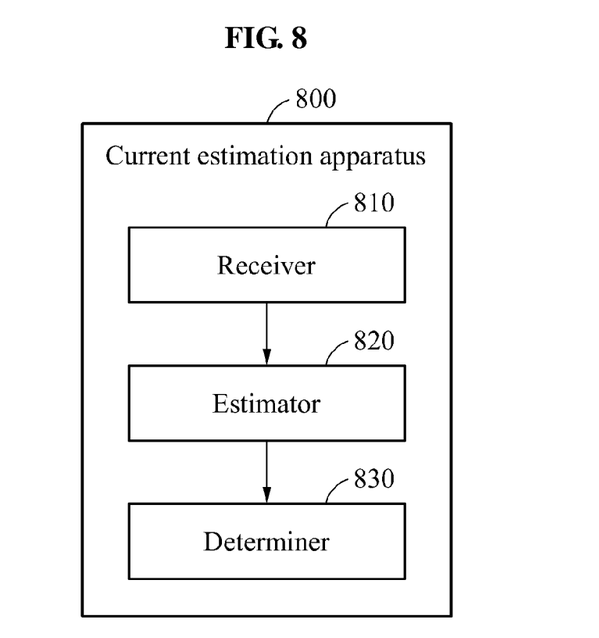
FIG. 8 illustrates an example of a current estimation apparatus.

FIG. 8 illustrates an example of a current estimation apparatus.

Referring to FIG. 8, in accordance with one configuration, the current estimation apparatus 800 includes a receiver 810 and an estimator 820. The current estimation apparatus 800 further includes a determiner 830.

The receiver 810 receives a voltage value of a battery pack and voltage values of cells included in the battery pack from a voltage sensor. For example, the voltage sensor measures an output voltage of the battery pack through decompression. In one configuration, the voltage sensor sequentially measures voltage values of the cells included in the battery pack.

The estimator 820 estimates current of the battery pack based on the voltage value of the battery pack, the voltage values of cells, and resistance components within the battery pack. The resistance components include resistance values of elements included in the battery pack. The elements included in the battery pack include a connection tab configured to connect the cells, a busbar including a portion of the cells and configured to connect battery modules constituting the battery pack, a terminal of the battery pack, and an inner wire of the battery pack. The estimator 820 estimates the current of the battery pack by further utilizing an inductance component generated by the inner wire of the battery pack.

The resistance values vary based on operating temperatures of the elements and operating times of the elements. For example, an element may have a resistance value having decreased by a predetermined rate according to an increase in an operating time.

The determiner 830 determines whether the current sensor which measures the current of the battery pack malfunctions. For example, the determiner 830 verifies whether the current sensor malfunctions based on error information received from the current sensor. The determiner 830 verifies whether the current sensor malfunctions by comparing a decrease width of voltage predicted based on the current value received from the current sensor and a decrease width of voltage verified through the voltage sensor. The determiner 830 verifies whether the current sensor malfunctions based on whether a measurement value of current received from the current sensor corresponds to one end of the range outputtable from the current sensor.

The technical matters described above with reference to FIGS. 1 through 7 may be applicable to the current estimation apparatus 800 of FIG. 8 and thus, a further description will be omitted.

According to example embodiments, there is provided a method that may estimate a current value of a battery pack without using a current sensor by estimating current of the battery pack based on a voltage value of the battery pack, voltage values of cells included in the battery pack, and resistance components within the battery pack.

Also, according to example embodiments, there is provided a technology that may perform cell balancing without using a current sensor, may secure the stability of a battery system, and enables the battery system to continuously operate by estimating at least one of a SOC, a SOH, and a SOF based on an estimate value of current flowing in the battery pack.

Also, according to example embodiments, current of a battery pack may be further accurately monitored by compensating for a measurement value of current received from a current sensor based on an estimate value of current according to a current estimation method.

The various modules, elements, and methods described above may be implemented using one or more hardware components, one or more software components, or a combination of one or more hardware components and one or more software components.

The apparatuses, units, modules, devices, and other components illustrated in FIGS. 1, 2, 3A, 3B, and 8 that perform the operations described herein with respect to FIGS. 5-7 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1, 2, 3A, 3B and 8. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-7 that perform the operations described herein with respect to FIGS. 1, 2, 3A, 3B and 8 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating current, the method comprising:
   receiving a voltage value of a battery pack and voltage values of cells comprised in the battery pack from a voltage sensor; and
   estimating a current of the battery pack based on the voltage value of the battery pack, the voltage values of the cells comprised in the battery pack, and resistance components disposed within the battery pack,
   wherein the resistance components comprise resistance values of elements comprised in the battery pack, and
   wherein the elements comprised in the battery pack comprise
      a connection tab configured to connect the cells;
      a busbar comprising a portion of the cells, and configured to connect battery modules constituting the battery pack;
      a terminal of the battery pack; and
      an inner wire of the battery pack.

2. The method of claim 1, wherein the resistance values vary based on operating temperatures of the elements comprised in the battery pack and operating times of the elements comprised in the battery pack.

3. The method of claim 1, further comprising:
   determining malfunctioning of a current sensor to measure the current of the battery pack,
   wherein the current of the battery pack is estimated in response to determining that the current sensor is malfunctioning.

4. The method of claim 3, wherein the malfunctioning of the current sensor is determined in response to a current value received from the current sensor corresponding to one end of a range outputtable from the current sensor.

5. The method of claim 3, wherein the malfunctioning of the current sensor is determined by comparing a decrease width of voltage predicted based on a current value received from the current sensor and a decrease width of voltage verified through the voltage sensor.

6. The method of claim 1, wherein a result of estimating the current is utilized to estimate at least one of a state of charge (SOC), a state of health (SOH), and a state of function (SOF) of the battery pack.

7. The method of claim 1, further comprising:
   compensating for a current value received from a current sensor to measure the current of the battery pack, based on a result of estimating the current.

8. The method of claim 1, wherein the current of the battery pack is estimated by further utilizing an inductance component generated by an inner wire of the battery pack.

9. A current estimation apparatus comprising:
   a receiver configured to receive a voltage value of a battery pack and voltage values of cells comprised in the battery pack from a voltage sensor; and
   an estimator configured to estimate current of the battery pack based on the voltage value of the battery pack, the voltage values of the cells comprised in the battery pack, and resistance components within the battery pack,
   wherein the resistance components comprise resistance values of elements comprised in the battery pack, and
   wherein the elements comprised in the battery pack comprise
      a connection tab configured to connect the cells;
      a busbar comprising a portion of the cells, and configured to connect battery modules constituting the battery pack;
      a terminal of the battery pack; and
      an inner wire of the battery pack.

10. The current estimation apparatus of claim 9, wherein the resistance values vary based on operating temperatures of the elements comprised in the battery pack and operating times of the elements comprised in the battery pack.

11. The current estimation apparatus of claim 9, further comprising:
    a determiner configured to determine malfunctioning of a current sensor to measure the current of the battery pack,
    wherein the estimator is configured to estimate the current of the battery pack in response to determining that the current sensor is malfunctioning.

12. The current estimation apparatus of claim 11, wherein the determiner determines the malfunctioning of the current sensor in response to a current value received from the current sensor corresponding to one end of a range outputtable from the current sensor.

13. The current estimation apparatus of claim 11, wherein the determiner determines the malfunctioning of the current sensor based on the current value received from the current sensor and the voltage value of the battery pack.

14. The current estimation apparatus of claim 9, further comprising:

a compensator configured to compensate for a current value received from a current sensor to measure the current of the battery pack, based on a result of estimating the current.

* * * * *